United States Patent [19]

Pasch

[11] Patent Number: 5,438,477

[45] Date of Patent: Aug. 1, 1995

[54] DIE-ATTACH TECHNIQUE FOR FLIP-CHIP STYLE MOUNTING OF SEMICONDUCTOR DIES

[75] Inventor: Nicholas F. Pasch, Pacifica, Calif.

[73] Assignee: LSI Logic Corporation, Milpitas, Calif.

[21] Appl. No.: 105,832

[22] Filed: Aug. 12, 1993

[51] Int. Cl.[6] .............................................. H05K 7/20
[52] U.S. Cl. ................................... 361/689; 165/80.3;
165/185; 257/713; 257/714; 257/719; 361/690;
29/890.03
[58] Field of Search ................. 29/840; 165/80.2, 80.3,
165/185; 174/16.3, 259, 260; 257/700, 712–714,
718–719, 725–727; 361/689, 690, 699, 702–704,
707, 708, 713, 717–718, 748, 760, 762, 769, 770,
787, 804, 807–812

[56] References Cited

U.S. PATENT DOCUMENTS

| | | | |
|---|---|---|---|
| 3,405,441 | 10/1968 | Asher et al. | 29/627 |
| 3,429,040 | 2/1969 | Miller | 20/626 |
| 3,694,699 | 9/1972 | Snyder et al. | 174/16.3 |
| 3,701,451 | 10/1972 | Schindler et al. | 220/27 |
| 3,811,186 | 5/1974 | Larnerd et al. | 29/626 |
| 3,871,014 | 3/1975 | King et al. | 357/67 |
| 3,909,838 | 9/1975 | Beyerlein | 357/70 |
| 3,984,860 | 10/1976 | Logue | 357/68 |
| 4,080,512 | 3/1978 | Ramet et al. | 174/68.5 |
| 4,100,566 | 7/1978 | Okikawa et al. | 357/70 |
| 4,120,020 | 10/1978 | Uden et al. | 361/386 |
| 4,141,030 | 2/1979 | Eisele et al. | 357/79 |
| 4,143,456 | 3/1979 | Inoue | 29/588 |
| 4,190,855 | 2/1980 | Inoue | 357/80 |
| 4,195,193 | 3/1980 | Grabbe et al. | 174/52 FP |
| 4,258,381 | 3/1981 | Inaba | 357/70 |
| 4,264,917 | 4/1981 | Ugon | 357/74 |
| 4,300,153 | 11/1981 | Hayakawa et al. | 357/80 |
| 4,330,790 | 5/1982 | Burns | 357/70 |
| 4,340,902 | 7/1982 | Honda et al. | 357/74 |
| 4,355,463 | 10/1982 | Burns | 29/827 |
| 4,363,076 | 12/1982 | McIver | 361/386 |
| 4,396,935 | 8/1983 | Schuck | 357/74 |

(List continued on next page.)

FOREIGN PATENT DOCUMENTS

| | | | |
|---|---|---|---|
| 0141967 | 5/1980 | Germany | 174/16.3 |
| 57-210638 | 12/1982 | Japan . | |
| 58-128754 | 8/1983 | Japan . | |
| 59-117244 | 7/1984 | Japan . | |
| 60-49638 | 3/1985 | Japan . | |
| 61-142750 | 6/1986 | Japan . | |
| 61-145838 | 7/1986 | Japan . | |
| 100756 | 2/1988 | Japan | 361/704 |
| 63-239827 | 10/1988 | Japan . | |
| 63-268418 | 11/1988 | Japan . | |
| 1-73753 | 3/1989 | Japan . | |
| 2-128453 | 5/1990 | Japan . | |
| WO92/11654 | 7/1992 | WIPO . | |

OTHER PUBLICATIONS

"LED Array Modules by New Technology Microbump Bonding Method", by Hatada et al., IEEE Transactions on Components, vol. 13, No. 3, Sep. 1990, pp. 521–527.
"Overmolded Plastic Pad Array Carriers (OMPAC)", by Freyman et al., IEEE, 1991, pp. 176–182.
"Pad Array Improves Density", Electronic Packaging & Production, May 1992 pp. 25–26.

*Primary Examiner*—Gregory D. Thompson

[57] ABSTRACT

A technique for forming bump bonded semiconductor device assemblies is described wherein a die attach structure is disposed between a semiconductor die and a substrate. Bump bonds (conductive bump contacts) are formed between the die and the substrate, outside of the periphery of the die attach structure. The die attach structure has a "rippled" or egg-crate shaped shape or texture characterized by alternating positive and negative peaks. The die is attached (e.g., by an adhesive) to the positive peaks, and the substrate is attached to the negative peaks. The die attach has the effect of anchoring the die to the substrate and absorbing mechanical shocks which would otherwise be transmitted to the conductive bump contacts. This serves to improve the shock resistance of the chip/substrate assembly. The die attach structure can be made to match the coefficient of expansion of the bump bonds as well as that of the die.

14 Claims, 2 Drawing Sheets

U.S. PATENT DOCUMENTS

| | | | |
|---|---|---|---|
| 4,408,218 | 10/1983 | Grabbe | 357/70 |
| 4,460,537 | 7/1984 | Heinle | 264/272.17 |
| 4,482,801 | 11/1984 | Habata et al. | 165/185 |
| 4,507,675 | 3/1985 | Fujii et al. | 357/70 |
| 4,545,610 | 10/1985 | Lakritz et al. | 29/589 |
| 4,587,550 | 5/1986 | Matsuda | 357/79 |
| 4,594,770 | 6/1986 | Butt | 29/588 |
| 4,620,215 | 10/1986 | Lee | 357/81 |
| 4,631,805 | 12/1986 | Olsen et al. | 29/588 |
| 4,654,754 | 3/1987 | Daszkowski | 174/16.3 |
| 4,680,617 | 7/1987 | Ross | 357/72 |
| 4,688,152 | 8/1987 | Chia | 361/408 |
| 4,700,276 | 10/1987 | Freyman et al. | 361/403 |
| 4,700,473 | 10/1987 | Freyman et al. | 29/846 |
| 4,705,917 | 11/1987 | Gates, Jr. et al. | 174/52 FP |
| 4,717,066 | 1/1988 | Goldenberg et al. | 228/179 |
| 4,763,188 | 8/1988 | Johnson | 357/74 |
| 4,771,330 | 9/1988 | Long | 357/80 |
| 4,772,936 | 9/1988 | Reding et al. | 357/80 |
| 4,800,419 | 1/1989 | Long et al. | 357/70 |
| 4,803,546 | 2/1989 | Sugimoto et al. | 357/81 |
| 4,825,284 | 4/1989 | Soga et al. | 357/80 |
| 4,857,483 | 8/1989 | Steffen et al. | 437/209 |
| 4,868,349 | 9/1989 | Chia | 174/52.4 |
| 4,872,825 | 10/1989 | Ross | 425/117 |
| 4,874,722 | 10/1989 | Bednarz et al. | 437/209 |
| 4,890,152 | 12/1989 | Hirata et al. | 357/72 |
| 4,890,194 | 12/1989 | Derryberry et al. | 361/386 |
| 4,913,930 | 4/1990 | Getson | 427/58 |
| 4,926,241 | 5/1990 | Carey | 357/75 |
| 4,933,741 | 6/1990 | Schroeder | 357/70 |
| 4,935,581 | 6/1990 | Komathu | 174/52.4 |
| 4,949,225 | 8/1990 | Sagisaka et al. | 361/414 |
| 4,955,132 | 9/1990 | Ozawa | 29/840 |
| 4,961,105 | 10/1990 | Yamamoto | 357/72 |
| 4,965,702 | 10/1990 | Lott et al. | 361/401 |
| 4,970,575 | 11/1990 | Soga et al. | 357/72 |
| 4,970,577 | 11/1990 | Ogihara et al. | 357/74 |
| 4,972,253 | 11/1990 | Palino et al. | 357/74 |
| 4,974,057 | 11/1990 | Tazima | 357/72 |
| 4,975,765 | 12/1990 | Ackermann et al. | 357/80 |
| 4,982,265 | 1/1991 | Watanabe et al. | 357/75 |
| 4,984,059 | 1/1991 | Kubota et al. | 357/68 |
| 4,985,748 | 1/1991 | Belanger, Jr. | 357/69 |
| 4,993,482 | 2/1991 | Dolbear et al. | 361/704 |
| 4,996,587 | 2/1991 | Hinrichsmeyer et al. | 357/74 |
| 5,006,673 | 4/1991 | Freyman et al. | 174/255 |
| 5,006,919 | 4/1991 | Disko | 357/72 |
| 5,012,386 | 4/1991 | McShane et al. | 361/386 |
| 5,025,114 | 6/1991 | Braden | 174/52.4 |
| 5,031,069 | 7/1991 | Anderson | 361/321 |
| 5,047,837 | 9/1991 | Kitano et al. | 357/81 |
| 5,048,166 | 9/1991 | Wakamatsu | 29/830 |
| 5,077,633 | 12/1991 | Freyman et al. | 361/403 |
| 5,111,279 | 5/1992 | Pasch et al. | 357/81 |
| 5,153,379 | 10/1992 | Guzuk et al. | 174/35 R |
| 5,153,385 | 10/1992 | Juskey et al. | 174/260 |
| 5,172,303 | 12/1992 | Bernardoni et al. | 361/396 |
| 5,195,023 | 3/1993 | Manzione et al. | 361/392 |
| 5,216,278 | 6/1993 | Lin et al. | 257/688 |

DIE-ATTACH TECHNIQUE FOR FLIP-CHIP STYLE MOUNTING OF SEMICONDUCTOR DIES

TECHNICAL FIELD OF THE INVENTION

The invention relates to techniques for mounting a semiconductor chip (die) or package to a substrate (another die, printed circuit board, or the like.

BACKGROUND OF THE INVENTION

Semiconductor technology has shown a general trend towards dramatic increases in integrated circuit speed and density. Both of these trends are facilitated by an overall reduction in device (circuit element) geometries (sizes). As semiconductor circuit elements become smaller, the distances between them on a semiconductor die become smaller, and parasitics (such as parasitic capacitances) and switching currents become smaller. In technologies such as CMOS, where overall current draw and switching speed characteristics are dominated by the effects of parasitics, the result is a reduction in total power consumption at the same time as switching speed is improved. Overall speed is further improved by the reduction in signal propagation time between active devices (e.g., transistors) resulting from the shorter distances involved. Nevertheless, in high speed integrated circuitry based on sub-micron geometries, delays in the tens or hundreds of picoseconds can be appreciable.

In order to minimize the length of wiring between semiconductor devices, a technique generally known as "flip chip" mounting is employed. A number of patents show that a semiconductor die (or "chip") can be "flip-chip" mounted and connected to another die (or "substrate") via a pattern or array of conductive bumps disposed on a surface of a semiconductor die, or on both the die and an underlying substrate. For example U.S. Pat. Nos. 4,825,284 and 4,926,241, incorporated by reference herein, describe methods for "flip-chip" mounting of a semiconductor die to a substrate by means of conductive (solder) bumps. Typically, the conductive bumps are ball-like structures formed of solder and disposed in a pattern on a surface of the die. A mating pattern of bond pads and/or similar conductive bumps is disposed on a surface of the underlying substrate. The die is positioned over the substrate and the conductive bumps on the die are "re-flowed" or otherwise fused to their counterpart connection elements on the surface of the substrate to form both electrical and mechanical connections between the die and the substrate.

Similar techniques are known in the art for mounting a semiconductor device package to a printed circuit board or other substrate, although they tend to be on a larger scale than the techniques for mounting a semiconductor die to a substrate. U.S. Pat. Nos. 4,700,276, 5,006,673, and 5,077,633, incorporated by reference herein, are generally directed to such techniques. Semiconductor devices employing conductive bumps are commonly referred to as "pad array chip carriers", or as "bump grid arrays". Other references to pad array chip carriers and similar mounting techniques are found in "Pad Array Improves Density" (*Electronic Packaging and Production*, May 1992, p. 25.), "Overmolded Plastic Pad Array Carriers (OMPAC): A Low-Cost, High Interconnect Density IC Packaging Solution for Consumer and Industrial Electronics", (Freyman and Pennisi, *IEEE Publication No.* 0569-5503/91/0000-176, 1991), and "LED Array Modules by New Technology Microbump Bonding Method" (Hatada, Fujimoto, Ochi, Ishida, *IEEE Transactions on Components, Hybrids and Manufacturing Technology*, Vol. 13, No. 3, Sep. 1990, pp. 521-527). A related mounting scheme is disclosed in U.S. Pat. No. 4,717,066, incorporated herein by reference, wherein a gold alloy is used for the conductive bumps (balls) rather than solder.

Hereinafter, all conductive bump connection techniques, both for chips (semiconductor dies, e.g., "flip-chip" mounting) and packaged semiconductor devices (e.g., pad array chip carriers) will be referred to collectively as "bump bonding", and the resulting assembly of one element to another will be referred to as a "bump-bonded assembly".

Generally, as used herein, a bump-bonded assembly includes one or more relatively small silicon chips (or packages) mounted in face-to-face relationship to a larger silicon chip, package, or substrate. Solder balls are formed on the opposing faces of the chips (or packages) and the substrate, at a number of positions corresponding to one another. In other words, the pattern and spacing of the solder balls on the chip (or package) match the pattern and spacing of solder balls on the substrate. Generally, for bump bonding semiconductor dies, the conductive bumps are arranged around a peripheral area of the die, although locating bumps in a central area of the die is also possible. The chip (or package) is brought into face-to-face relationship with the substrate, and with the solder balls of the chip (or package) aligned with the solder balls of the substrate. The chip (or package) and substrate are subjected to heat, which (ideally) causes the solder balls of the chip (or package) to fuse with the corresponding solder balls of the substrate, thereby forming solder joints between the chip and the substrate.

When using bump bond technology, there are significant reliability issues associated with the bump breaking in use. It is widely known in the art that conductive bump connections between a die and a substrate may (and often will) break because of differences in rates of thermal expansion between the die and the substrate. Thermally induced mechanical stresses at the conductive bump bonds can build up to a point where the mechanical structure of the conductive bump fails and the bump breaks or is "torn" away from the die.

Although this failure mechanism is well documented, it is by no means the only failure mechanism. Stresses on conductive bumps caused by mechanical shock of moderate values (50–100 g's) can easily exceed the strength of the bump bond connections. In the absence of completely uniform distribution of stress over the array of solder bumps, individual conductive bumps can easily be broken, or torn away from the die, by stresses of this magnitude.

When added to the probability of thermally-induced bump bond failures, the probability of mechanical shock-induced bump bond failures augments the overall problems associated with bump bonding, and makes conventional bump bonding techniques unsuitable for many harsh environments (e.g., many automotive, aircraft and military applications) without some auxiliary means of limiting mechanical shock.

One possible approach to preventing mechanical shock-induced failures of bump bonds is to anchor the die firmly to the substrate in the process of forming bump bond connections, for example, via a die attach structure (e.g., a planar "spacer" between the die and substrate to which both are firmly attached). For example, commonly-owned U.S. Pat. No. 5,111,279, incorporated by reference herein, discloses a preformed planar structure interposed between a chip and a substrate which is formed of materials which will tend to draw the chip towards the substrate. In this manner the die is secured and prevented from converting mechanical shock into shear forces at the bump bond connections. Unfortunately, however, this may exacerbate the problem of alleviating thermally induced stresses within the die itself, and thermal mismatches between the die and the substrate. Since the die is now firmly mounted to the substrate (via the planar spacer), any stresses due to thermal coefficient mismatch are transmitted directly to the die, creating a risk of fracturing the die.

Further, thermal coefficient mismatch with the die attach structure can create additional thermally-induced stress problems. For example, as the die attach structure (interposed between the die and the substrate) is subjected to thermal changes, it may expand at a different rate in the vertical direction (i.e., in the die-to-substrate direction) than the bump bond connections (e.g., solder joints). As a result, the die attach structure can create a situation where the bump bond connections are literally being pulled apart by the thermal expansion of the die attach structure.

The die can be cooled to reduce thermally induced stresses, both at the bump bond connections and within the die itself. Conductive cooling via heat-sink structures can be used, but this approach tends to be bulky and expensive. Many active approaches to cooling are known in the art, including fan-forced gas (e.g., air) cooling whereby a flow of a cooling gas is directed at or around the die. A die attach structure, depending upon the material used, can provide some conductive cooling. However, a die attach structure interposed between the die and the substrate, particularly a planar structure interposed between the die and the substrate, tends to limit gas or fluid-based cooling in the die by preventing gas or fluid flow between the die and the substrate. This can be particularly troublesome in multi-tier stacked flip-chip assemblies where some dies may have very little exposed surface area.

What is needed is a die attach structure, suitable for interposition between a die (e.g., a semiconductor chip or package) and a substrate (e.g., another semiconductor chip or a printed circuit board), which mechanically joins the chip to the substrate without augmenting thermal stress problems of the assembled chip and substrate, and which facilitates cooling of the die.

DISCLOSURE OF THE INVENTION

It is therefore an object of the present invention to provide a improved technique for bump bonding (e.g., flip-chip mounting) of semiconductor dies.

It is a further object of the present invention to provide a bump bonding technique which substantially reduces the probability of mechanical shock-induced failures.

It is a further object of the present invention to accomplish the foregoing objects without adding significantly to the probability of thermal stress-induced failures.

It is a further object of the present invention to provide an improved technique for bump bonding which facilitates cooling of semiconductor dies.

According to the invention, a non-planar die attach structure is interposed between a die and a substrate.

The die attach structure is suitably made of a thin sheet of material deformed in two or three dimensions to have a first set of peaks (positive excursions) on one side and a second set of peaks (negative excursions) on an opposite side.

In one embodiment, the die attach structure is rippled, having a "travelling-S" cross section. Vertical peaks extend longitudinally across the structure on both sides of the structure.

In another embodiment, the die attach structure is formed like an egg-crate, exhibiting arrays of peaks on both sides.

In both embodiments, the peaks on one side of the structure are attached (such as with an adhesive) to the die, and the peaks on the other side of the structure are attached to the substrate. The non-planar shape of the die attach structure provides stress-relief for solder bump connections between the die and the substrate. The die attach structure of the present invention is robust to the stresses associated with shock and preferably matches the coefficient of expansion of the solder bumps. The die attach structure is sized to fit within a central area of the die, so that the ball bump connections (e.g., solder joints) can be made outside the periphery of the die attach structure. The peaks on the one side of the die attach structure are coplanar, and the peaks on the opposite side of the die attach structure are also coplanar—the plane of the peaks of the opposite side being vertically offset from the plane of the one side.

In the one embodiment of the invention, the die-attach structure is "rippled" or accordion-shaped (zig-zag folded), and is sized to fit between a die and a substrate (i.e., its area is made somewhat smaller than the outline of the die so that it fits inside of the bump bond connections (which are typically disposed just inside the periphery of the die), and its height is equal to the desired spacing between the die and substrate). In this respect, the height of the die-attach structure defines the ultimate height of solder joints formed between the die and the substrate. The die-attach structure is essentially a "sheet" of material formed in a "rippled" configuration similar to that of corrugated fiberglass or steel. Such rippled shapes are characterized by an overall planar volume, with a cross-section exhibiting a series of positive and negative peaks.

According to an aspect of the invention, the "rippled" shape of the die attach structure can be a sinusoidal, or other curved "travelling-S" shape.

According to another aspect of the invention, the "rippled" shape of the die attach can be a "triangular-wave" or "sawtooth" shape.

If developed in two dimensions (i.e., if the cross-section is kept constant in one direction, see FIGS. 1 and 2, described in greater detail hereinbelow), "channels" (void areas extending in a longitudinal dimension) are formed between the positive (e.g. top) and negative (e.g., bottom) peaks of the die-attach structure. When the die-attach structure is assembled between a die and substrate, gas or fluid can be directed through these longitudinal channels to cool the die.

The die-attach structure is assembled in a central area between a die and a substrate such that the die attaches to the top peaks of the die attach structure and the substrate attaches to the bottom peaks of the die attach structure (or vice-versa). Conductive bump contacts on the die and the substrate mate outside of the central area of the die-attach structure, in a peripheral area of the die. By anchoring the die to the substrate, the die-attach structure protects the conductive bump contacts (bump bonds) from mechanical shock stress and substantially increases the magnitude of the shock required to damage the conductive bump contacts. Additionally, the rippled shape of the die-attach structure exhibits desirable flexibility or "springiness", as compared with conventional (prior-art) planar structures and die attach techniques.

Mismatches can occur between the thermal coefficients of expansion (TCE's) of the die and the die-attach structure. Given identical material choices, however, the mismatch is no greater than that which would be observed with a conventional die attach. In fact, according to the invention, with proper material selection, the TCE mismatch can be greatly reduced.

In matching the vertical coefficient of expansion of the solder bumps to the coefficient of the die attach, it is necessary to select a die-attach material with a coefficient of thermal expansion which exceeds that of the crystal silicon die material. Most metals, including aluminum, copper, and magnesium, meet this requirement.

The matching of the coefficient of expansion of the die-attach structure to the silicon die material is accomplished by controlling the offset of the positive and negative peaks of the die-attach structure. A "die-attach" angle ("$\Theta$") is defined by a line drawn between the positive and negative peaks of the die attach "rippled" shape, and another line drawn across the positive (or negative) peaks. (If the die attach is not angularly symmetrical, i.e., if the angles are different on opposite sides of an attach point, then the "steeper" die-attach angle dominates.) In this manner, the apparent vertical coefficient of expansion is effectively the TCE of die attach material times the die-attach angle $\Theta$.

This effect (of apparent vertical coefficient of expansion) can be used to minimize the mismatch in vertical coefficients of thermal expansion of the die-attach structure and the solder bumps, thereby providing for secure anchoring of the die and protection of the conductive bump contacts from mechanical shock without causing thermally-induced mechanical stresses (in the vertical direction) at the conductive bump contacts.

In the other embodiment of the invention, a three-dimensional egg-crate shaped die attach can be formed which has rows and columns of alternating positive and negative peaks. Open paths exist in egg-crate structures through which cooling gas or fluid can be directed. Whereas these paths were longitudinal, in the rippled die-attach structure, in the egg-crate shaped embodiment the paths will be more sinuous. By virtue of the fully developed three-dimensional structure of the die attach, thermal coefficient mismatches can be accommodated in three dimensions. Generally, the egg-shape embodiment exhibits similar benefits as does the rippled embodiment of the die-attach structure.

By securely anchoring the die, the inventive die-attach structure reinforces the flip-chipped assembly, and absorbs a significant portion of any mechanical shock applied to the assembly, thereby protecting the conductive bump contacts and reducing the probability of shock-induced failures of bump bond connections.

In part due to the flexibility of the rippled die attach and in part due to TCE matching, the inventive die-attach technique does not worsen thermal stresses within the assembly, and with proper selection of materials and shapes, can reduce thermally induced stresses.

"Channels" or paths through the "rippled" (or egg-crate) shape of the die attach permit cooling gas or fluid to be directed through the die-attach structure between the die and the substrate, permitting improved cooling of the die.

Other objects, features and advantages of the invention will become apparent in light of the following description thereof.

DETAILED DESCRIPTION OF THE INVENTION

In order to reduce mechanical shock-induced stresses at the conductive bump connections of a bump bonded semiconductor die, it is necessary to provide some form of stress relief. This is accomplished by using a rippled, or otherwise texturally deformed die-attach structure between the bonding faces of a die and a substrate. The geometry of the die-attach structure is also of benefit vis-a-vis thermal stress failures. Various embodiments of a die-attach structure are contemplated by the present invention. Examples of "rippled" and "egg-crate" shaped die-attach structures are set forth below.

Figure 1:
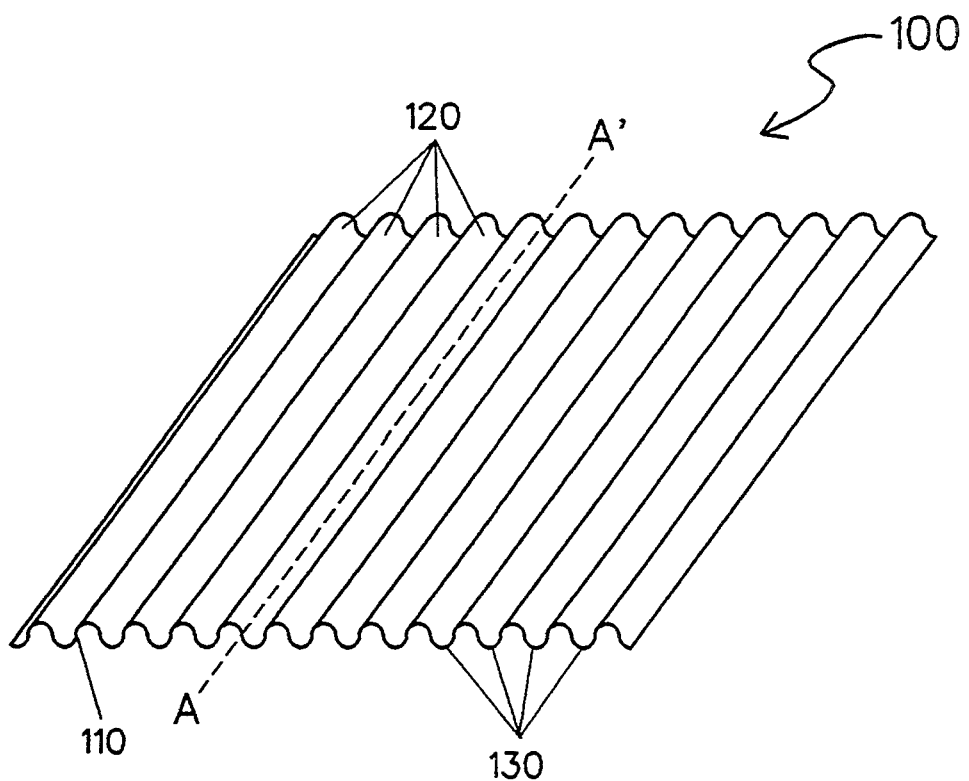
FIG. 1 is a perspective view of a "travelling-S" rippled die-attach structure, according to the invention.

FIG. 1 shows an example of a "rippled" or "travelling-S" die attach structure 100, sized to fit between a die and a substrate (i.e., its area is somewhat smaller than the outline of the die so that it fits inside of the bump bond connections, and its height is selected to establish a desired spacing between the die and the substrate). The die-attach structure 100 is essentially a "sheet" of material formed (by any suitable means) to exhibit a "rippled" shape (cross-section). The "rippled" characteristic shape is clearly seen at an edge 110 of the die-attach structure, where a sinusoidal "travelling-S" shape is evident. This "rippled" shape (or texture) of the die attach 100 is a two-dimensional shape, i.e., it has a constant cross-section in one dimension, and is characterized by top peaks 120 and bottom peaks 130 offset from the top peaks. In use, the top peaks are attached to a surface of a die with a suitable adhesive (such as epoxy), and the bottom peaks are attached to a surface of a substrate with a suitable adhesive (such as epoxy). In this manner, the die-attach structure forms a mechanical joint between the die and the substrate. In use, the die-attach structure is sized to be somewhat smaller than the smaller of the die and the substrate (typically the die is smaller than the substrate), in order that conductive bump contacts on the opposing faces of the die and substrate will form solder joints outside the periphery of the die-attach structure.

The rippled cross-section of the die-attach structure results in longitudinal "channels" being formed between the top peaks 120 and bottom peaks 130. One such channel is indicated generally along the line A—A' extending longitudinally across the die attach 100. When the die-attach structure is assembled between the opposing faces of a die and a substrate, gas or fluid can be directed through these channels to assist in cooling the die, thereby alleviating certain adverse effects of heating.

Figure 2:
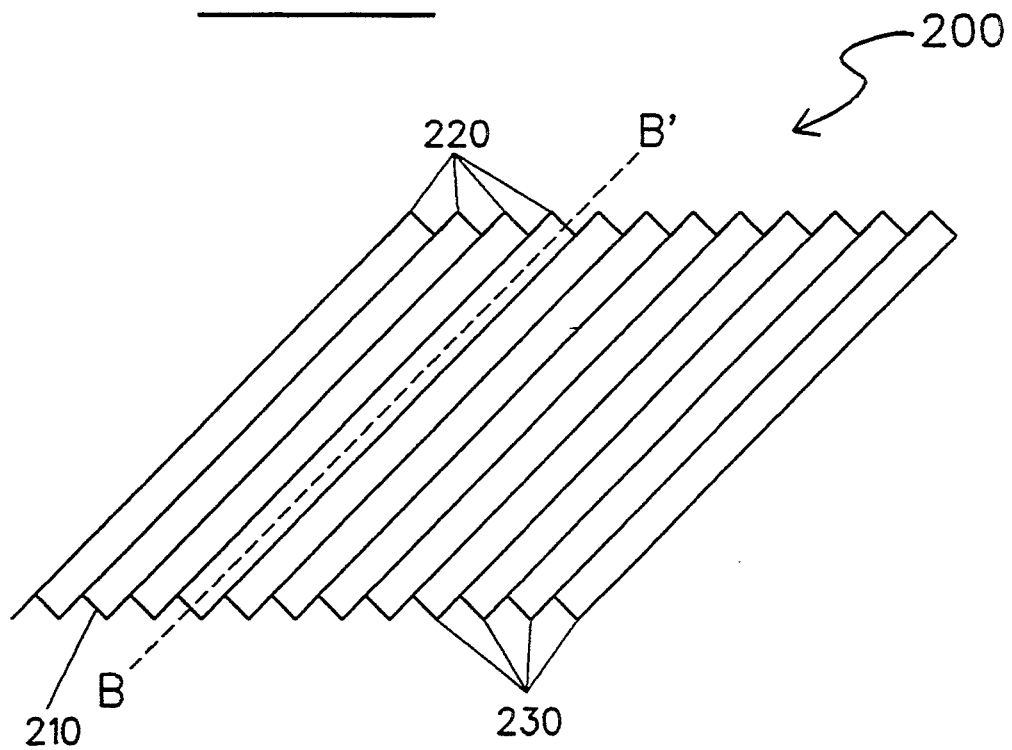
FIG. 2 is a view of a "triangular" or "sawtooth" rippled die-attach structure, according to the invention.

FIG. 2 shows an alternate embodiment 200 of a "rippled" die attach, similar to the travelling-S die attach 100 of FIG. 1, but having a two-dimensional triangular "sawtooth" shape rather than the sinusoidal (traveling-S) shape shown in FIG. 1. As before, the die attach 200 is sized to fit between a die and a substrate, and is essentially a "sheet" of attach material formed in a "rippled" sawtooth configuration. The triangular sawtooth shape is clearly seen at an edge 210 of the die attach. Similar to the die attach 100 (FIG. 1), the shape of the die attach 200 has top peaks 220 which attach to the die and bottom peaks 230 which attach to the substrate. "Channels" between the top peaks 220 and bottom peaks 230, such as the one indicated generally along the line B—B', extend across the die attach 200, through which gas or fluid can be directed through these channels to cool the die (once assembled).

Figure 3:
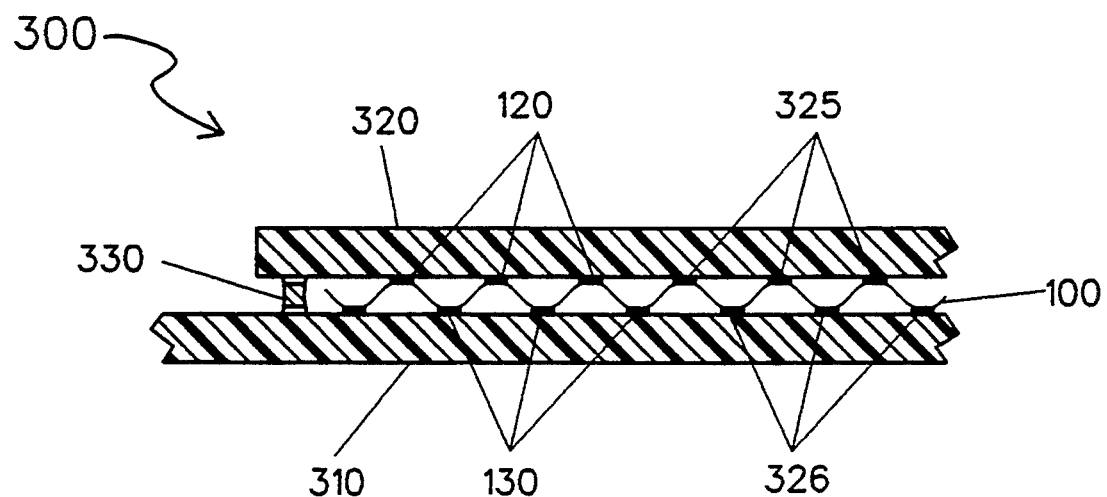
FIG. 3 is a cross-sectional view of a semiconductor device assembly including a rippled die-attach structure, according to the invention.

FIG. 3 is a cross-sectional view of an assembly 300 wherein a die 320 is bump bonded to a substrate 310, using the die-attach structure 100 of FIG. 1. (The die-attach structure 200 of FIG. 2 could be substituted.) The die 320 attaches to the top peaks 120 of the die-attach structure 100 by an adhesive 325 and the substrate 310 attaches to the bottom peaks 130 of the die attach 100 by an adhesive 326. Conductive bump contacts 330 (one shown) electrically connect the die 320 to the substrate 310. By providing a mechanical connection between the die 320 to the substrate 310, the die-attach structure 100 protects the conductive bump contacts 330 (bump bonds) from mechanical shock stress and substantially increases the magnitude of the shock required to damage the conductive bump contacts 330. In addition, the rippled shape of the die-attach structure 100 will exhibit a certain degree of flexibility or "springiness", further alleviating the adverse effects of mechanical shock.

It will be evident to one of ordinary skill in the art that a mismatch can occur between the thermal coefficients of expansion (TCE's) of the die 320 and the die-attach structure 100. (A similar mismatch can occur between the substrate 310 and the die attach 100.) The mismatch, however, will be no greater than that which would otherwise be observed with a conventional die attach (given the same materials). However, according to the present invention, the "rippled" shape of the die-attach structure can exhibit beneficial thermal expansion behavior, especially in the vertical (as depicted in FIG. 3) direction, and the coefficient of expansion of the die-attach structure 100 can be tailored to match the coefficient of expansion of the conductive bump contacts 330, thereby reducing stresses caused by differences in vertical thermal expansion. By appropriate selection of a material for the die-attach structure 100 (which selection will be determined by the particular application for which the die-attach structure is employed), a die-attach structure 100 can be created that simultaneously matches the coefficient of expansion of the conductive bump contacts 330 (for example, solder) and reduces the effect of the coefficient of expansion mismatch between the die 320 and the substrate 310.

In matching the vertical coefficient of expansion of the conductive bump contacts 330 to the coefficient of expansion of the die attach structure 100, the only requirement for selecting the material for the die-attach structure 100 is that its temperature coefficient of expansion exceeds that of the crystal silicon material making up the die 320. This requirement is not difficult to meet, since most metals, including aluminum, copper, and magnesium, have temperature coefficients of expansion greater than crystal silicon.

The apparent vertical coefficient of expansion of the die-attach structure can be controlled by its rippled shape, and matched well to the coefficient of expansion of the die. For the rippled shapes of FIGS. 1 and 2 (or any textured shape exhibiting positive and negative peaks), a die-attach angle $\Theta$ is defined as the angle formed by the intersection of a line drawn between a positive peak and the next vertically offset negative peak with a line drawn across the positive (or negative) peaks. In a case where the die-attach structure is asymmetrical, the steeper of two or more angles determined in this manner dominates in the calculation of the apparent vertical thermal coefficient of expansion. The apparent vertical thermal coefficient of expansion is suitably determined as the thermal coefficient of expansion (TCE) of the material of the die-attach structure times the sin of the dominant die-attach angle $\Theta$.

Hence, by proper selection of materials, the actual and apparent thermal coefficients of expansion for the die-attach structure can be tailored to match the thermal coefficients of expansion of both the solder joints of the conductive bump contacts and the silicon die. In this manner, the die-attach structure provides for secure anchoring of the die to the substrate and provides protection from mechanical shock for the conductive bump contacts, without causing thermally-induced mechanical stresses (in the vertical direction) at the conductive bump contacts.

In a conventional prior-art die attach scenario, a TCE mismatch between the substrate and the die can cause thermally-induced stresses to occur which can crack the die or cause it to become detached from the substrate. The "rippled" shape of the die-attach structure of the present invention can be used to accommodate this mismatch in at least two different ways. First, the "rippled" shape has a certain amount of flexibility in at least one dimension (horizontal, as depicted in FIGS. 1 and 2) and can absorb some of the thermal stress. Second, as will be evident to one of ordinary skill in the art, similar thermal coefficient matching between the die and the substrate can be accomplished by controlling the angles between points of attachment of the die and substrate to the die attach, in a manner similar to that described above for matching vertical coefficients of expansion. By proper selection of both die attach material and die attach angle, both vertical and horizontal coefficients will be matched.

It will readily be appreciated by one of ordinary skill in the art that cooling gas or fluid can be directed between the die 320 and the substrate 310 through the channels (e.g., along line A—A', FIG. 1) to improve heat dissipation from the die.

Although the rippled, or two-dimensionally deformed shapes for a die-attach structure provide flexibility in two dimensions (laterally and vertically), they do not provide "flexibility" in the longitudinal direction (i.e., along line A—A' of FIG. 1, or along line B—B' of FIG. 2). In order to achieve flexibility, and similar benefits thereof, in the longitudinal dimension, it is necessary to provide a three-dimension texture to the die-attach structure.

Figure 4:
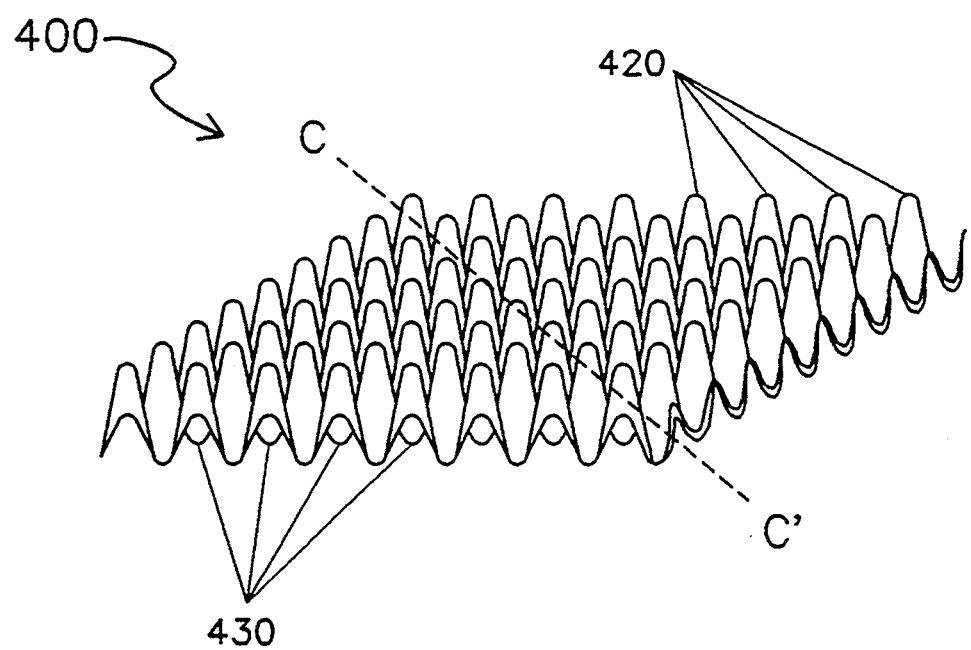
FIG. 4 is a view of a die-attach structure with an egg-crate "texture", according to the invention.

FIG. 4 shows a die-attach structure exhibiting deformations in three-dimensions. An example resembling an egg-crate is illustrated in FIG. 4. The egg-crate shape has rows and columns of alternating positive peaks 420 and negative peaks 430. Further, open paths exist in the egg-crate structures (e.g., along line C—C') through which cooling gas or fluid can be directed. By virtue of the fully developed three-dimensional structure of the die-attach structure 400, thermal coefficient mismatches can be simultaneously accommodated in three dimensions (rather than only two, as was the case with the rippled shapes of FIGS. 1 and 2). In other words, the concepts discussed hereinabove with respect to rippled shapes are simply extended (to the longitudinal dimension) with the three-dimensionally deformed egg-crate (or similar) shape of the die-attach structure 400.

One skilled in the art to which the present invention most nearly pertains will understand that the choice of whether to use the traveling "S" structure, the triangular structure or the fully developed egg crate structure will be made depending upon the magnitude of the mismatch of TCE's of the substrate, conductive bump and die materials, and will vary from application to application.

What is claimed is:

1. A semiconductor device assembly comprising:
   a semiconductor die having a first thermal coefficient of expansion;
   a substrate having a second thermal coefficient of expansion;
   conductive bump contacts between a surface of the semiconductor die and a surface of the substrate in a pre-defined pattern such that the surface of the die and the surface of the substrate are substantially parallel to one another and are facing one another; and
   a die attach structure disposed between the surface of the die and the surface of the substrate, said die attach structure formed from a sheet of material having a shape characterized by alternating positive and negative peaks and sized to fit within an area defined by the conductive bump contacts, the substrate being attached to the negative peaks of the die attach structure and the die being attached to the positive peaks of the die attach structure.

2. A semiconductor device assembly according to claim 1, wherein:
   the shape is a sinusoidal travelling-S shape.

3. A semiconductor device assembly according to claim 1, wherein:
   the shape is a triangular sawtooth shape.

4. A semiconductor device assembly according to claim 1, wherein:
   the shape is a three-dimensional "egg-crate" shape characterized by rows and columns of alternating positive and negative peaks.

5. A semiconductor device assembly according to claim 4, wherein:
   the conductive bump contacts have a third thermal coefficient of expansion; and
   the material and shape of the die attach structure are chosen such that a fourth thermal coefficient of expansion of the die attach structure in a direction perpendicular to the surface of the substrate closely matches the third thermal coefficient of expansion.

6. A semiconductor device assembly according to claim 4, wherein:
   the conductive bump contacts have a third thermal coefficient of expansion; and
   the material and shape of the die attach structure are chosen such that a fourth thermal coefficient of expansion of the die attach structure in a direction perpendicular to the surface of the substrate and a fifth thermal coefficient of expansion of the die attach structure in a direction parallel to the surface of the semiconductor die closely match the first and third thermal coefficients of expansion, respectively.

7. A semiconductor device assembly according to claim 1, wherein:
   the third thermal coefficient of expansion is greater than the first thermal coefficient of expansion.

8. A semiconductor device assembly according to claim 1, wherein:
   the die attach structure has "channels" between the positive and negative peaks through which cooling gas or fluid can be directed therethrough.

9. A semiconductor device assembly according to claim 1, wherein:
   the conductive bump contacts have a third thermal coefficient of expansion;
   the material and shape of the die attach structure are chosen such that a thermal coefficient of expansion of the die attach structure in a direction perpendicular to the substrate closely matches the third thermal coefficient of expansion of the conductive bump contacts.

10. A method of making a semiconductor device assembly, comprising the steps of:
    providing a semiconductor die having a first thermal coefficient of expansion;
    providing a substrate having a second thermal coefficient of expansion;
    forming conductive bump contacts between a surface of the semiconductor die and a surface of the substrate in a pre-defined pattern such that the surface of the die and the surface of the substrate are substantially parallel to one another and are facing one another;
    disposing a die attach structure between the surface of the die and the surface of the substrate, said die attach structure being formed from a sheet of material sized to fit within the pattern of conductive bump contacts, and having a rippled shape characterized by alternating positive peaks and negative peaks;
    attaching the substrate to the negative peaks of the die attach; and
    attaching the die to the positive peaks of the die attach.

11. A method according to claim 10, wherein:
    the shape is a sinusoidal travelling-S shape.

12. A method according to claim 10, wherein:
    the shape is a triangular sawtooth shape.

13. A method according to claim 10, wherein:
    the shape is a three-dimensional "egg-crate" shape characterized by rows and columns of alternating positive and negative peaks.

14. A method according to claim 13, wherein:
    the conductive bump contacts have a third thermal coefficient of expansion; and
    the material and shape of the die attach structure are chosen such that a fourth thermal coefficient of expansion of the die attach structure in a direction perpendicular to the surface of the substrate closely matches the third thermal coefficient of expansion.

* * * * *